United States Patent
Curtiss et al.

(10) Patent No.: US 6,740,163 B1
(45) Date of Patent: May 25, 2004

(54) PHOTORESIST RECIRCULATION AND VISCOSITY CONTROL FOR DIP COATING APPLICATIONS

(75) Inventors: Donald Everett Curtiss, Los Gatos, CA (US); Joseph Leigh, Campbell, CA (US); Frank Quan, Pleasanton, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 7 days.

(21) Appl. No.: 10/021,501

(22) Filed: Dec. 19, 2001

Related U.S. Application Data

(60) Provisional application No. 60/298,705, filed on Jun. 15, 2001.

(51) Int. Cl.[7] .................................................. B05C 3/00
(52) U.S. Cl. ........................ 118/423; 118/602; 118/603; 118/688
(58) Field of Search ................................ 118/423, 688, 118/612, 610, 56, 52, 429, 602, 603

(56) References Cited

U.S. PATENT DOCUMENTS

| | | | |
|---|---|---|---|
| 3,207,127 A | * | 9/1965 | Smith, Jr. |
| 4,655,162 A | * | 4/1987 | Kameyama ................. 118/612 |
| 4,856,456 A | * | 8/1989 | Hillman et al. ............. 118/400 |
| 4,967,782 A | * | 11/1990 | Yamashita et al. |
| 5,045,435 A | | 9/1991 | Adams et al. |
| 5,066,616 A | | 11/1991 | Gordon |
| 5,516,545 A | | 5/1996 | Sandock |
| 5,538,754 A | | 7/1996 | Sandock |
| 5,656,088 A | * | 8/1997 | Sugimoto et al. |
| 5,902,402 A | * | 5/1999 | Durst et al. |
| 6,199,562 B1 | | 3/2001 | Hayes et al. |

* cited by examiner

*Primary Examiner*—Brenda A. Lamb
(74) *Attorney, Agent, or Firm*—McDermott, Will & Emery

(57) ABSTRACT

A method of performing dip coating of a layer of a resist material on a surface of a substrate, comprising steps of:

(a) providing a dip coating vessel having an interior space containing a dip coating liquid comprising a solution of the resist material in a solvent, the dip coating vessel being open at the top thereof;

(b) providing a substrate having a surface, immersing the substrate in the dip coating liquid in the vessel via the open top, and withdrawing the substrate from the vessel via the open top thereof, thereby forming a layer of resist material on the surface; and (c) monitoring and maintaining the viscosity of the dip coating liquid supplied to the dip coating vessel at a predetermined value.

Also disclosed is an apparatus for performing the method.

11 Claims, 3 Drawing Sheets

PHOTORESIST RECIRCULATION AND VISCOSITY CONTROL FOR DIP COATING APPLICATIONS

CROSS-REFERENCE TO PROVISIONAL APPLICATION

This application claims priority from U.S. provisional patent application Ser. No. 60/298,705 filed Jun. 15, 2001, the entire disclosure of which is incorporated herein by reference.

FIELD OF THE INVENTION

The present invention relates to methods and apparatus for applying a layer of a resist, e.g., a photoresist, to both sides of dual-sided substrates, e.g., disk-shaped substrates. The invention finds particular utility in performing resist coating of substrates as part of manufacturing processing of hard disk magnetic and/or magneto-optical recording media, e.g., for servo patterning, protective layer formation, etc.

BACKGROUND OF THE INVENTION

Spin coating of wafer-shaped substrates or workpieces is a widely utilized process in the manufacture of semiconductor integrated circuit ("IC") devices for applying thin, uniform thickness layers of a coating material, e.g., a photoresist, to the wafer surfaces as part of photolithographic patterning of the IC component devices, interconnections, etc., and is increasingly employed as part of the manufacturing process of disk-shaped magnetic and/or magneto-optical ("MO") recording media, such as hard disks, for patterning the surfaces of such media, as for example, in the formation of servo patterns therein by means of imprint lithographic techniques.

A typical spin coating apparatus according to the conventional art is schematically illustrated in the cross-sectional view of FIG. 1, wherein reference numeral 1 designates a disk-shaped rotatable table or vacuum chuck, supported by a rotatable shaft 2 perpendicular to the plane of table 1, the latter being connected to motor 3 for rotation about a central axis. Wafer 11 is fixed to the surface of table or vacuum chuck 1 by means of suction ports (not shown in the drawing for simplicity).

Reference numeral 4 indicates a process bowl or cup surrounding rotatable table or vacuum chuck 1, the bottom of which includes at least one exhaust port 5 for removal of superfluous (i.e., excess) resist (or other coating material) which is scattered about during the spin coating process due to centrifugal force; reference numeral 6 indicates a plate or flange for regulating the air currents flowing in the process bowl or cup 4 in order to enhance coating thickness uniformity; and reference numeral 7 indicates an exhaust port for connection to an exhaust source; reference numeral 8 designates a coating material dispensing nozzle, operatively connected via feed tube or conduit 9 to a source 10 of a coating material, e.g., a photoresist.

In operation of the above-described spin coating apparatus, the coating material, e.g., a photoresist, is dispensed from nozzle 8 of source 10 onto the surface of wafer 11 as the wafer is spun by means of rotatable chuck 1. The spinning of the wafer distributes the photoresist over the surface of the wafer and exerts a shearing force that separates excess photoresist from the wafer and evaporates solvent therefrom, thereby providing a thin, smooth, uniform thickness layer of photoresist on the surface of the wafer.

More specifically, and with reference to FIG. 2, the spin coating process as described above comprises 3 distinct process steps or phases, as follows:

1. Resist spin-on—generally the substrate or workpiece, in the form of an annularly-shaped disk, spins at a low spindle speed during this phase, e.g., about 500 rpm, with a resist dispensing nozzle at the end of a movable arm initially positioned facing the inner diameter ("ID") of the disk. The nozzle/arm assembly dispenses the coating material, e.g., a resist such as a polymethylmethacrylate ("PMMA") or other photo-sensitive resist, onto the top surface of the disk at a controlled rate and duration. The slow spindle speed ensures that the resist is uniformly distributed from the ID to the outer diameter ("OD") of the disk, and the flow rate of the resist is adjusted so as to provide a sufficient amount of resist during the spreading process.

2. Resist spin-off—in order to facilitate uniform spreading of the resist, a high spindle speed (e.g.,>1,000 rpm) spin-off step is performed in the next phase to remove superfluous (i.e., excess) resist. Conventional spin coating apparatus, such as illustrated in FIG. 1, therefore include a vacuum exhaust system which operates at the backside of the disk to ensure removal of the excess resist without either re-depositing resist material on the top surface of the disk or other critical equipment components located above the disk.

3. Edge bead removal (not shown in FIG. 2)—subsequent to resist spin-off at high spindle speed, the resist-coated disk is subjected to solvent cleaning at the OD disk edge for edge bead removal and a backside wash in order to ensure that the disk OD does not retain a ring (i.e., edge bead) of accumulated resist at the top edge surface; the backside wash protects against undesired resist contamination of the back side (i.e., bottom) of the disk.

In order to facilitate resist coating of both sides of a disk-shaped substrate or workpiece (i.e., "dual-sided" coating) according to conventional automated manufacturing practices utilizing typical prior art spin coating stations, e.g., as shown in FIG. 1, a disk inversion (or "flipping") station must be provided intermediate separate first and second spin coating stations for sequential coating of the top and bottom disk surfaces. While such an arrangement can be fairly readily implemented, this approach entails several disadvantages, as follows:

1. a certain amount of resist material applied to a first (e.g., top) surface of the disk at a first spin coating station, will inevitably flow to the second surface of the disk, i.e., the bottom or backside surface, which resist flow is problematic at at least the second spin coating station;

2. the area ("equipment footprint") occupied by the overall spin coating station is increased due to the requirement for first and second spin coating stations;

3. excessive equipment downtime due to malfunctioning, maintenance, etc., of the first and second spin coating stations and intermediate substrate (e.g., disk) flipping station; and 4. increased equipment cost due to the necessity for providing the second spin coating station and the substrate flipping station.

In view of the above-described drawbacks and disadvantages associated with conventional spin coating methodology when utilized for coating both sides of a dual-sided substrate, as in the case of disk-shaped magnetic and MO recording media such as hard disks, dip coating techniques in which a vertically oriented substrate is immersed in and removed from a bath of photoresist solution in an open container, have been considered as a potentially desirable substitute therefor. Specifically, such dip coating process/apparatus can be readily implemented for coating both sides of two-sided substrates, with an attendant reduction in photoresist loss which minimizes photoresist usage. However, conventional dip coating techniques utilizing open dip cup apparatus (described in more detail below) incur several disadvantages and drawbacks, as follows:

1. Increase in viscosity over time—The photoresist solution, composed of a polymeric photoresist material and at least one solvent therefor, is contained in a tank or vessel ("dip cup") and exposed to the ambient atmosphere, i.e., air. As a consequence of the continuous exposure of the photoresist solution to air, evaporation of the solvent occurs, resulting in an increase in the viscosity of the photoresist solution over time. The increase in viscosity in turn leads to an increase in the thickness of the photoresist coating formed on the substrate surfaces. However, consistent photoresist coating thickness is vital for obtaining acceptable products or results when utilized as part of a manufacturing process, e.g., as a step in the formation of servo-patterned magnetic and MO recording media utilizing imprint lithography of resist-coated substrates. Specifically, a variation, i.e., an increase, in resist layer thickness is problematic in that the latter is a key process variable or parameter in servo pattern formation via imprint lithography utilizing etching or implantation processing for pattern generation in the media surfaces. For example, if the surface patterning is performed by etching utilizing the photoresist layer in patterned form as a selective masking layer, a photoresist layer which is too thick will result in an insufficiently deep etched pattern. As a consequence of the reduced etch depth, the desired spacing between the transducer head and the base of the etched pit will not be obtained, resulting in a reduction in the signal-to-noise ratio ("SNR"). Attentively, if the media surface is patterned by implantation processing utilizing a patterned (i.e., embossed or imprinted) resist layer of varying thickness as an implantation mask, the increased thickness of the photoresist layer arising from the increase in viscosity of the photoresist solution increases the required penetration distance of the implanted species, which in turn reduces the magnitude of the desired alteration of magnetic properties of the selectively implanted areas of the substrate surface forming the desired pattern. Again, the result is the SNR of the medium is disadvantageously reduced.

2. Incorporation of Particulates—A problem frequently associated with photoresist dip coating processes is the incorporation of particulate matter in the photoresist solution. Specifically, the open dip cup utilized for containing the photoresist solution applied to the substrate surfaces by dipping the substrate thereinto, is highly susceptible to contamination by various types of particulate matter. In instances where the photoresist solution is contaminated with particles, debris, etc., the latter are readily transferred to subsequent substrates immersed in the contaminated photoresist solution in the dip cup. In such event, it becomes necessary to terminate the dip coating process, discard, and then replace the entire volume of photoresist solution in the dip cup. As a consequence, contamination of the photoresist solution with particles, debris, etc., can entirely eliminate the benefit of low photoresist consumption afforded by the dip coating process.

In view of the above-described drawbacks and disadvantages inherent in the open cup dip coating approach for applying a layer of a coating material, e.g., a photoresist layer, to both sides of dual-sided substrates, e.g., disk-shaped substrates such as utilized in the manufacture of semiconductor integrated circuit devices and magnetic and/or MO recording media, there exists a clear need for improved means and methodology for performing dip coating of dual-sided substrates such as semiconductor wafers and disks for magnetic and/or MO recording media. More specifically, there exists a need for an improved means and methodology for simultaneously dip coating both sides of dual-sided substrates in an open dip cup coating station, whereby each of the above-described drawbacks and disadvantages accruing from the use of conventional open dip cup resist coating stations is avoided.

The present invention addresses and solves problems, difficulties, drawbacks, and disadvantages associated with the conventional open dip cup coating station approach for dip coating of a resist material on both sides of dual-sided substrates, e.g., semiconductor wafers and disk-shaped substrates employed in the manufacture of hard disk magnetic and/or MO recording media, the drawbacks and disadvantages including resist thickness variation/increase, particle contamination, downtime, and high resist. usage/waste, while maintaining full compatibility with all aspects of conventional automated manufacturing technology, e.g., for semiconductor IC and recording media manufacture. Further, the means and methodology afforded by the present invention enjoy diverse utility in spin coating of a variety of materials on a number of different types of substrates and workpieces.

DISCLOSURE OF THE INVENTION

An advantage of the present invention is an improved open dip cup apparatus for dip coating a layer of a resist material on a surface of a substrate.

Another advantage of the present invention is an improved apparatus for simultaneously dip coating a layer of a resist material on the oppositely facing major surfaces of a disk-shaped substrate for a magnetic or magneto-optical recording medium.

A further advantage of the present invention is an improved method of performing dip coating of a layer of a resist material on a surface of a substrate.

Still another advantage of the present invention is an improved method of performing simultaneous dip coating of a layer of a resist material on the oppositely facing major surfaces of a disk-shaped substrate for a magnetic or magneto-optical recording medium.

Yet another advantage of the present invention is an improved method and apparatus for performing open dip coating of substrates in a continuous process while maintaining the viscosity of the dip coating liquid constant at a desired level and removing particulate matter therefrom.

Additional advantages and other aspects and features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are obtained in part by an improved apparatus for performing dip coating of a layer of a resist material on at least one surface of a substrate, comprising:
- a dip coating vessel having an interior space adapted for containing therein a liquid for dip coating of a substrate, the dip coating liquid comprising a solution of the resist material in a solvent, the vessel being open at the top thereof;
- a substrate mounting means for introducing into and withdrawing a substrate from the interior space of the dip coating vessel via the open top; and
- a viscosity control system for continuously monitoring and maintaining the viscosity of a dip coating liquid supplied to the dip coating vessel at a predetermined value.

According to an embodiment of the present invention, the viscosity control system includes a recirculation loop for continuously or periodically recirculating the dip coating liquid in the dip coating vessel; wherein, according to a particular embodiment of the invention, the recirculation loop includes a reservoir for the dip coating liquid, with an inlet conduit connected between the reservoir and the dip coating vessel for supplying dip coating liquid from the reservoir to the dip coating vessel, and an outlet conduit connected between the dip coating vessel and the reservoir for returning dip coating liquid from the dip coating vessel to the reservoir.

In accordance with certain embodiments of the present invention, the recirculation loop provides periodic recirculation of the dip coating liquid in the dip coating vessel and comprises a bypass conduit for periodically diverting, thus interrupting, flow of the dip coating liquid between the reservoir and the dip coating vessel; wherein the recirculation loop provides recirculation of the dip coating liquid in the dip coating vessel only when a substrate is immersed in the dip coating liquid in the dip coating vessel and includes a pair of 3-way flow valves for flowing the dip coating liquid through the bypass conduit in response to a signal provided by the substrate mounting means.

According to embodiments of the present invention, the recirculation loop further includes a pump connected to the inlet conduit for recirculating the dip coating liquid; and the recirculation loop further includes a filter connected to the inlet conduit for removing particulate matter from the dip coating liquid.

Embodiments of the present invention include providing the recirculation loop as including a device for continuously measuring the viscosity of the dip coating liquid in the reservoir and a solvent dispensing system for supplying the solvent for the resist material to the reservoir in response to the measured viscosity.

According to certain embodiments of the present invention, the solvent dispensing system includes a tank for containing the solvent and a conduit between the solvent tank and the reservoir for supplying a flow of solvent from the solvent tank to the reservoir; and the solvent dispensing system further includes a valve for controlling the flow of solvent in the conduit between the solvent tank and the reservoir, and valve flow control means responsive to the measured viscosity for controlling the solvent flow and thereby maintaining the predetermined viscosity of the dip coating liquid in the reservoir and in the dip coating vessel.

In accordance with further embodiments of the present invention, the reservoir further includes agitator means for uniformly mixing solvent supplied by the solvent dispensing system with the dip coating liquid in the reservoir; and the substrate mounting means includes means for vertically mounting a disk-shaped substrate comprising a pair of oppositely facing major surfaces to be simultaneously dip coated, and means for rotating the disk-shaped substrate about a central axis.

Another aspect of the present invention is an improved method of performing dip coating of a layer of a resist material on a surface of a substrate, comprising steps of:
- (a) providing a dip coating vessel having an interior space containing therein a liquid for dip coating, the dip coating liquid comprising a solution of the resist material in a solvent, the dip coating vessel being open at the top thereof;
- (b) providing a substrate having a surface, immersing the substrate in the dip coating liquid in the dip coating vessel via the open top, and withdrawing the substrate from the dip coating vessel via the open top, thereby forming a layer of the resist material on the substrate surface; and
- (c) monitoring and maintaining the viscosity of the dip coating liquid supplied to the dip coating vessel at a predetermined value.

In accordance with embodiments of the present invention, step (b) comprises providing and immersing a vertically oriented, disk-shaped substrate having a pair of opposed major surfaces while rotating the disk-shaped substrate about a central axis, thereby simultaneously forming a layer of the photoresist material on each of the pair of surfaces; and step (c) comprises providing a continuous viscosity control system including a circulation loop for continuously or periodically recirculating the dip coating liquid in the dip coating vessel.

According to embodiments of the present invention, step (c) comprises providing a recirculation loop including a reservoir for the dip coating liquid, with an inlet conduit connected between the reservoir and the dip coating vessel for supplying dip coating liquid from the reservoir to the dip coating vessel, and an outlet conduit connected between the dip coating vessel and the reservoir for returning dip coating liquid from the dip coating vessel to the reservoir.

In accordance with certain embodiments of the present invention, step (c) comprises providing a recirculation loop for periodically recirculating the dip coating liquid in the dip coating vessel, the recirculation loop comprising a bypass conduit for periodically diverting, thus interrupting, flow of the dip coating liquid between the reservoir and the dip coating vessel; wherein step (c) comprises providing a recirculation loop for recirculating the dip coating liquid in the dip coating vessel only when a substrate is immersed in the dip coating liquid in the dip coating vessel, and the recirculation loop includes a pair of 3-way flow control valves for flowing the dip coating liquid through the bypass conduit in response to a signal provided by the substrate mounting means.

According to embodiments of the present invention, step (c) further comprises providing a recirculation loop including a pump connected to the inlet conduit for recirculating the dip coating liquid and a filter connected to the inlet conduit for removing particulate matter from the dip coating liquid, and step (c) further comprises providing a recirculation loop including a device for continuously measuring the viscosity of the dip coating liquid in the reservoir and a solvent dispensing system for supplying the solvent for the resist material to the reservoir in response to the measured viscosity.

In a particular embodiment of the present invention, step (c) comprises providing a solvent dispensing system including a tank for containing the solvent and a conduit between the solvent tank and the reservoir for supplying a flow of solvent from the solvent tank to the reservoir; and according to certain embodiments of the invention, a solvent dispensing system is provided which further comprises a valve for controlling the flow of solvent in the conduit between the solvent tank and the reservoir, and valve flow control means responsive to the measured viscosity for controlling the solvent flow and thereby maintaining the predetermined viscosity of the dip coating liquid in the reservoir and in the dip coating vessel.

In accordance with a further embodiment of the present invention, step (c) further comprises providing the reservoir with agitator means for uniformly mixing solvent supplied by the solvent dispensing system with the dip coating liquid in the reservoir.

According to an embodiment of the present invention having particular utility in the manufacture of recording media, step (b) comprises providing a disk-shaped substrate for a hard disk magnetic or magneto-optical (MO) recording medium and the resist material is a photoresist.

Yet another aspect of the present invention is an improved apparatus for performing dip coating of a layer of a resist material on at least one surface of a substrate, comprising:

an open cup dip coating vessel having an interior space for containing therein a dip coating liquid; and means for monitoring and maintaining the viscosity of the dip coating liquid supplied to the dip coating vessel at a predetermined value.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which like reference numerals are employed throughout to designate similar features, and the pertinent features are not necessarily drawn to scale but rather are drawn as to best illustrate the pertinent features, wherein.

DESCRIPTION OF THE INVENTION

The present invention addresses, solves, and effectively eliminates difficulties, drawbacks, and disadvantages attendant upon performing dip coating of a resist material, e.g., a photoresist, on substrates/workpieces such as dual-surfaced disk-shaped substrates as are employed in the manufacture of hard disk recording media, i.e., magnetic and/or magnetic-oprical (MO) media, when the dip coating process utilizes conventional, open cup dip coating methodology. The present invention is based upon the discovery that uniform thickness, defect-free resist coating layers, e.g., photoresist layers, may be satisfactorily simultaneously applied, in continuous, automatable fashion, to the opposite major surfaces of dual-sided substrate/workpieces, e.g., disk-shaped substrates for hard disk magnetic or MO recording media, by means of a continuously operating open cup dip coating process and apparatus wherein the viscosity of the dip coating liquid supplied to the open cup is continuously monitored, controlled, and maintained constant over time and wherein contamination of the dip coating liquid with particulate matter and debris is prevented.

According to a key feature of the present invention, the dip coating liquid is continuously or periodically recirculated between the open cup dip coating vessel and a reservoir for the dip coating liquid, the reservoir being provided with means for continuously monitoring, controlling, and maintaining the viscosity of the dip coating liquid at a predetermined value. Another key feature is the provision of a filter in the recirculation loop between the reservoir and the dip coating vessel, for providing continuous removal of particulate matter, debris, etc., from the dip coating liquid. The inventive means and methodology embodying the dip coating liquid viscosity control and particulate matter removal concepts of the present invention therefore provide several advantages vis-a-vis conventional open cup dip coating means and methodology, including, inter alia:

1. maintenance of constant resist coating thickness over extended intervals when utilized as part of a continuous, automated manufacturing process; and 2. formation of high quality coatings free of defects such, as particulate matter and voids.

Figure 3:
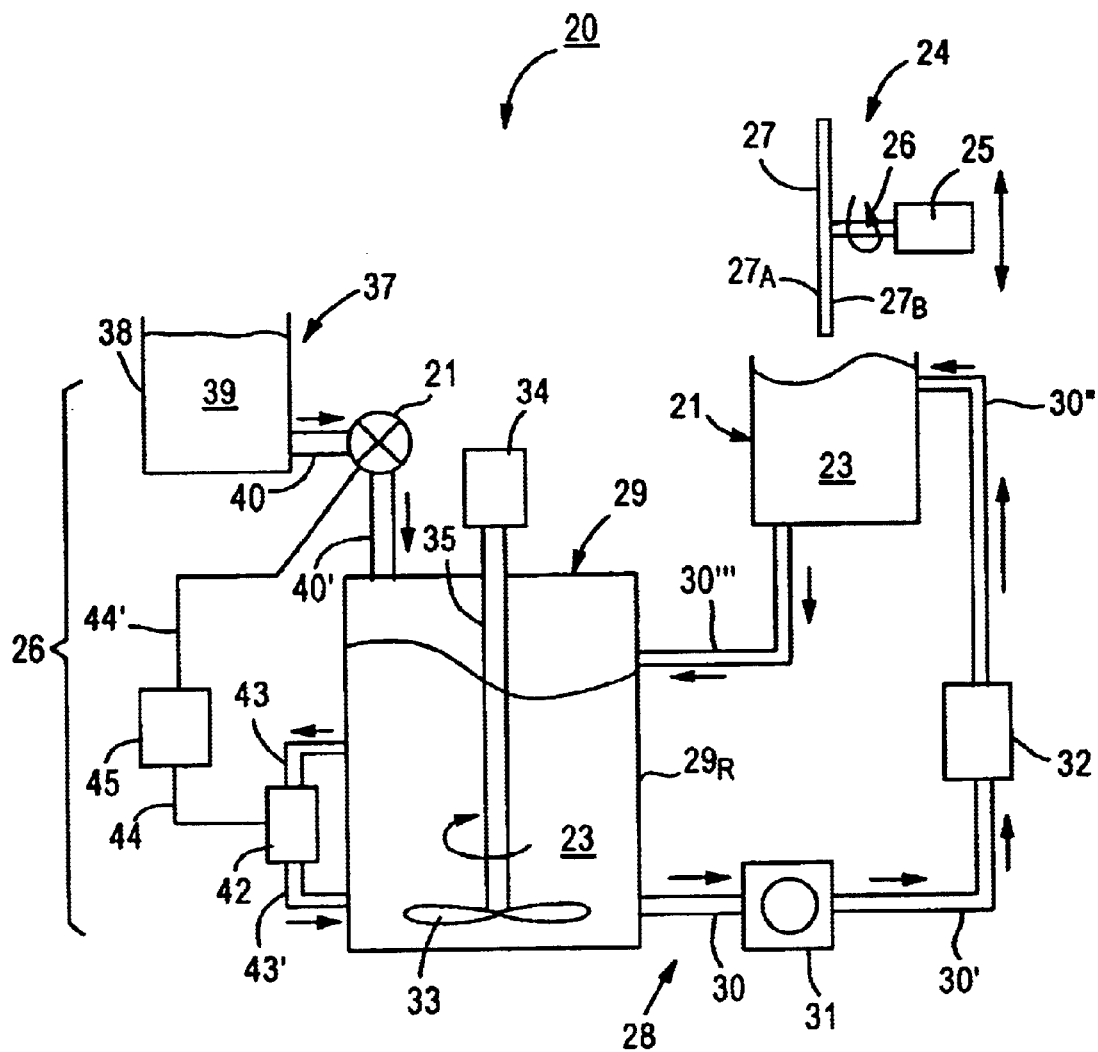
FIG. 3 is a simplified schematic diagram of an apparatus for performing simultaneous dual-sided dip coating according to an embodiment of the present invention.

Referring now to FIG. 3, shown therein, by way of illustration but not limitation, is a simplified, schematic view of an improved dip coating system 20 according to an embodiment of the present invention wherein the dip coating liquid is subjected to continuous recirculation. As illustrated, dip coating system 20 comprises a dip coating vessel 21 open at the top and adapted for accommodating in the interior thereof a dip coating liquid 23, typically a solution of a resist material, e.g., a polymer-based photoresist such as of a polymethyl methacrylate ("PMMA") dissolved in a suitable solvent, e.g., an ether such as anisole or a ketone. Positioned above the open top of the dip coating vessel 21 is a substrate/workpiece mounting means 24 including a motor 25 connected to a rotatable spindle or shaft 26 adapted for mounting at the distal end thereof a vertically oriented substrate/workpiece 27, illustratively a dual-sided, disk-shaped substrate having a pair of opposed major surfaces $27_A$, $27_B$, e.g., as typically utilized in the manufacture of hard disk recording media such as magnetic and MO media. Mounting means 24 is further adapted for controllably moving substrate/workpiece 27 in a vertical direction (by means not shown for illustrative simplicity) for lowering of substrate/workpiece 27 into the dip coating vessel 21 via the open top thereof for immersion in the dip coating liquid 23 for a desired interval, while simultaneously rotating the disk-shaped substrate/workpiece 27 about a central axis for simultaneous forming a uniform thickness layer of the dip coating liquid 23 on both major opposed surfaces $27_A$, $27_B$ thereof, after which interval the dip-coated substrate/ workpiece 27 is withdrawn from the dip coating vessel 21 via the open top thereof by upward movement by mounting means 24, while maintaining rotation of the disk-shaped substrate/workpiece 27 about its central axis for ensuring a uniform coating thickness and for spin-off of excess dip coating liquid 23.

Operatively connected to dip coating vessel 21 is a dip coating liquid (e.g., resist solution) circulation loop 28 forming part of a viscosity control system 26 for continuously monitoring, controlling and maintaining the viscosity of dip coating liquid 23 supplied to the open cup dip coating vessel 21 at a predetermined value for ensuring reliable and consistent formation of a precisely controlled thickness dip coating layer on substrate/workpiece surfaces $27_A$, $27_B$. Circulation loop 28 includes a container or tank 29 adapted to contain therein a greater volume of dip coating liquid 23 than is contained in dip coating vessel 21, the container or tank 29 forming a reservoir $29_R$ of a relatively large volume of dip coating liquid 23. Dip coating liquid reservoir $29_R$ is fluidly connected to the dip coating vessel 21 via inlet (supply) conduit segments 30, 30', and 30" for supplying the latter with dip coating liquid 23 by connecting the bottom of reservoir $29_R$ to the upper end of the dip coating vessel 21. As illustrated, a pump means 31 for establishing a flow of dip coating liquid 23 from the reservoir $29_R$ to the dip coating vessel 21 is provided between inlet conduit segments 30 and 30' for flowing dip coating liquid 23 from reservoir $29_R$ to dip coating vessel 21. The dip coating liquid circulation loop 28 further includes an in-line filter 32 positioned between inlet conduit segments 30' and 30" for removing particulate matter, debris, etc. from dip coating liquid 23 supplied to dip coating vessel 21 from reservoir $29_R$. Completing circulation loop 28 is an outlet conduit 30'" fluidly connected between the bottom end of dip coating vessel 21 and an upper end of reservoir $29_R$ for withdrawing dip coating liquid 23 from the former for return to the latter.

As illustrated, dip coating liquid reservoir $29_R$ further includes an agitator means 33 at the bottom end thereof, operatively connected to motor 34 by means of shaft 35 for rotation about a central axis thereof, for providing stirring of the dip coating liquid 23 therein to prevent any phase separation thereof and for evenly mixing any solvent added thereto by the viscosity control system 26. According to the illustrated embodiment, the viscosity control system 26 includes a solvent dispensing system 37 fluidly connected to the upper end of reservoir $29_R$ for dip coating liquid 23, wherein the solvent dispensing system 37 includes a tank 38 adapted for containing in the interior thereof a liquid solvent 39 for the coating material (e.g., a resist), the liquid solvent 39 typically being the same as, or at least similar to, the solvent utilized for the coating material solution forming the dip coating liquid 23. Solvent tank 38 is fluidly connected at the bottom end thereof to the upper end of reservoir $29_R$ via conduit segments 40, 40' and an electrically or pneumatically operable valve 41 for supplying solvent liquid 39 to the dip coating liquid 23 in reservoir $29_R$. Viscosity control system 26 further includes a viscometer 42 fluidly connected to the dip coating liquid 23 in reservoir $29_R$ via inlet and outlet conduit segments 43, 43', which arrangement provides for continuous sampling and measurement of the viscosity of dip coating liquid 23 in reservoir $29_R$. An output signal representative of the measured viscosity of dip coating liquid 23 in reservoir $29_R$ is supplied from viscosity measuring device 42, via line segments 44, 44' and electronic controller/comparator 45 to the solvent supply control valve 41, for controlling/regulating the flow of solvent liquid 39 from solvent tank 38 to the dip coating liquid 23 in reservoir $29_R$ for continuously maintaining the viscosity thereof at a predetermined value previously inputted to the set-point controller/comparator 45.

In operation of system 10, a plurality of substrates/workpieces 27, illustratively dual-sided, disk-shaped substrates for hard disk recording media having major surfaces $27_A$ and $27_B$, are sequentially dip coated with a layer of coating material, typically a resist material such as of PMMA, by dipping into and removal from the dip coating liquid 23 in open cup dip coating vessel 21 while being rotated about a central axis. (While not explicitly shown in FIG. 3 for illustrative simplicity, in practice of system 10, the dip-coated substrates/workpieces 27 removed from the open cup dip coating vessel 21 for spin-off of excess dip coating liquid 23 are positioned, via mounting means 24, at a sufficient distance from the dip cup vessel 21 as to effectively prevent return of the excess dip coating liquid 23 to the dip cup vessel 21, thereby minimizing any possibility of contamination of the dip coating liquid 23).

In order to prevent any change (i.e., increase) in viscosity of the dip coating liquid 23 arising from evaporation of the solvent for the resist material forming the dip coating liquid which may occur over time, leading to an undesirable increase in thickness of the dip-coated layer formed on surfaces $27_A$ and $27_B$ of substrate 27, according to this embodiment of the invention, the dip coating liquid 23 supplied to the open dip coating vessel 21 is continuously recirculated to and mixed with a larger amount of dip coating liquid 23 contained in a reservoir $29_R$, by means of dip coating liquid recirculation system 28. The latter is provided with a continuously operating viscosity measurement and control system 26, comprised of a tank 38 containing a liquid solvent 39 for the coating material fluidly connected to the dip coating liquid reservoir $29_R$, and a continuous viscosity measurement device 42, whereby an output signal from the latter representative of the measured viscosity of the dip coating liquid 23 provides continuous control of the flow of solvent 39 from tank 38 for replacing any solvent 39 lost due to evaporation. As a consequence, the viscosity of the dip coating liquid 23, hence the thickness of the dip coating layer(s) formed on the substrate surfaces $27_A$ and $27_B$, is are maintained constant over an extended interval of operation of system 10. In addition, the dip coating liquid recirculation system 28 is provided with a filter 32 for continuously removing particulate matter and other debris from the dip coating liquid 23 which can result in defects, voids, etc., adversely affecting coating quality.

Figure 4:
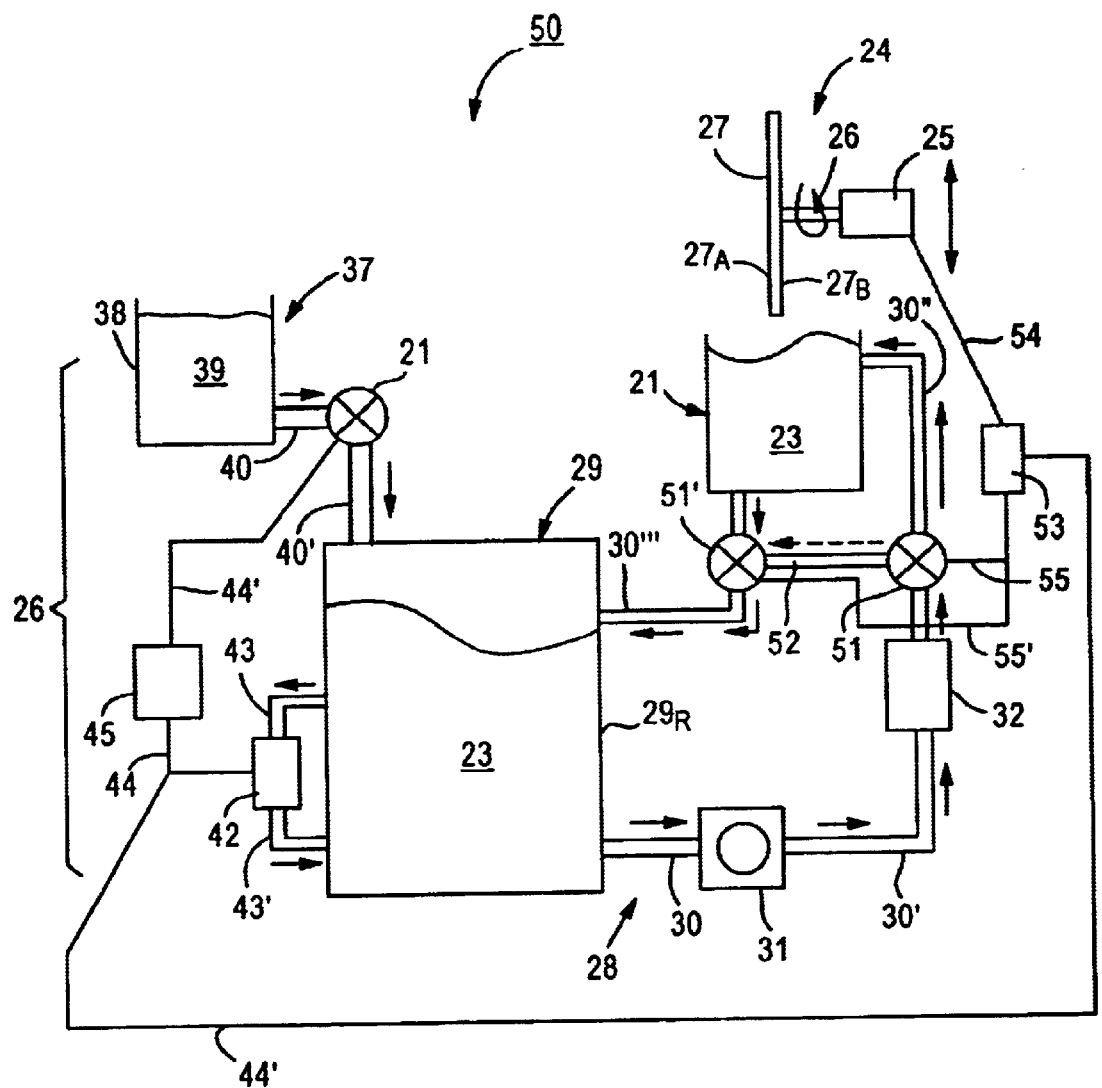
FIG. 4 is. a simplified schematic diagram of an apparatus for performing simultaneous dual-sided dip coating according to another embodiment of the present invention

Adverting to FIG. 4, shown therein, by way of illustration, but not limitation, is a simplified, schematic view of another improved dip coating system 50 according to the invention (utilizing the same reference numbers as in FIG. 3 for designating the same or similar features), illustrating an embodiment wherein the dip coating liquid 23 supplied to the dip coating vessel 21 is periodically rather than continuously recirculated.

Figure 1:
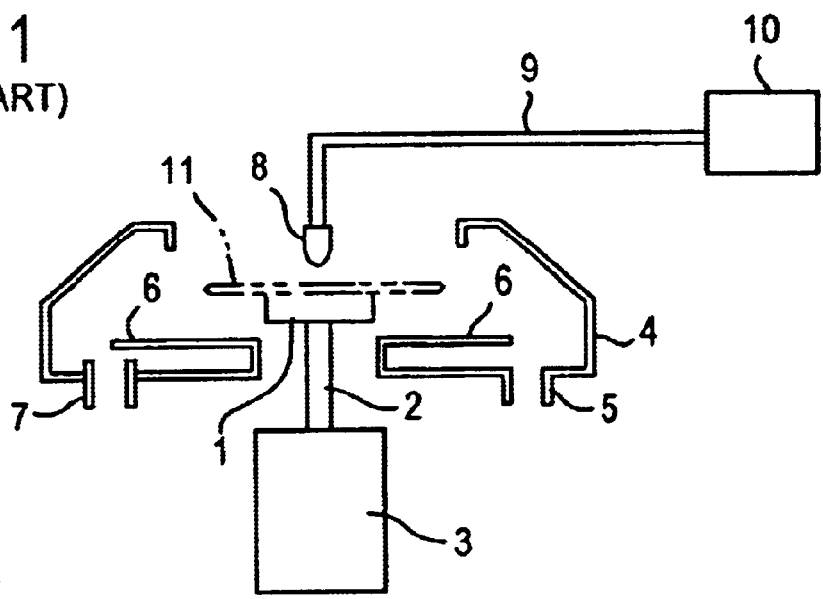
FIG. 1 is a schematic, simplified cross-sectional view of a conventional spin coating apparatus utilized for spin coating a surface of a workpiece/substrate.
Figure 2:
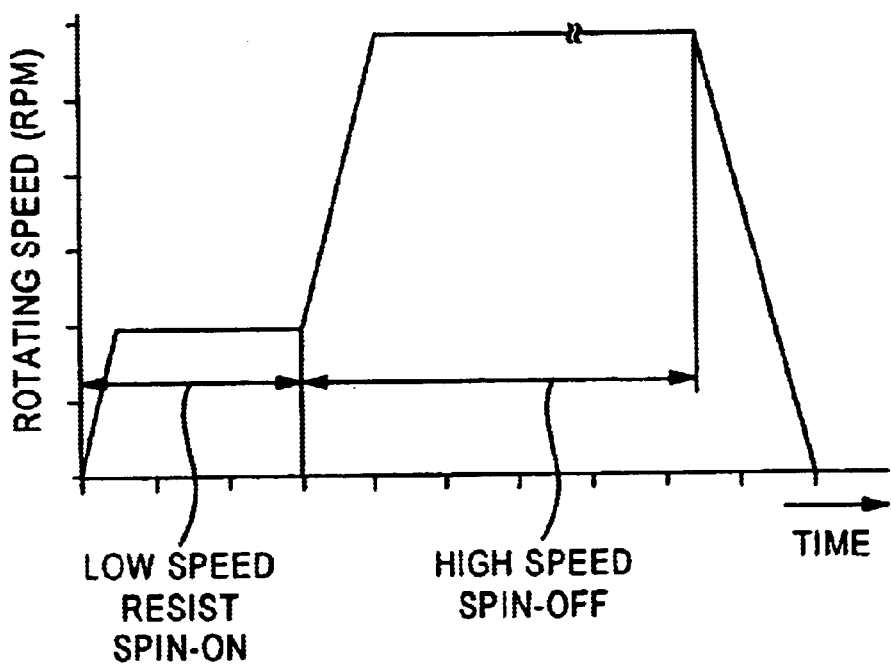
FIG. 2 is a graph showing the spin-on and spin-off phases of a conventional spin coating process utilizing the spin coating apparatus of FIG. 1.

According to this embodiment, a pair of electrically or pneumatically operable, first and second 3-way valves 51 and 51', respectively, are inserted in inlet conduit segment 30" and outlet conduit 30'", respectively, and fluidly connected together by means of bypass conduit 52. Each of the 3-way valves 51 and 51' is operated by means of controller 53 connected at its input end to the substrate/workpiece mounting means 24 via line 54 and at its output end to valves 51 and 51' via lines 55 and 55', respectively. In addition, according to this embodiment, the agitator means 33, motor 14, and connecting shaft 15 of the embodiment of FIG. 1 are eliminated.

In operation of the embodiment of FIG. 4, valves 51 and 51' are placed in their closed positions during intervals when a substrate/workpiece 27 is immersed in the dip coating liquid 23 contained in dip coating vessel 21, by means of a signal transmitted thereto from the substrate/workpiece mounting means 24 via the combination of signal input line 54, controller 53, and respective signal output lines 55 and 55'. As a consequence, dip coating liquid 23 supplied to the first 3-way valve 51 from reservoir $29_R$ via inlet conduit segments 30 and 30' flows through bypass conduit. 52 to the second 3-way valve 51' and back to reservoir $29_R$ via outlet conduit segment 30''', whereby the dip coating liquid 23 contained in dip coating vessel 21 remains static (i.e., unrecirculated) during the interval in which dipping of the substrate/workpiece 27 occurs. During this interval, the dip coating liquid 23 contained in the dip coating liquid reservoir $29_R$ is mixed at constant flow (with agitation) with any solvent added thereto by means of the solvent dispensing system 37, via recirculation through the inlet, bypass, and outlet conduits 30, 30', 52, and 30''', respectively, driven by recirculation pump 31. When the viscosity of the dip coating liquid 23 contained in dip coating liquid reservoir $29_R$ reaches the desired viscosity, as measured by viscometer 42 and inputted to controller 53 via line 44', the first and second 3-way valves 51 and 51', respectively, are opened during intervals when a substrate/workpiece 27 is not immersed in the dip coating liquid 23 in the dip coating vessel 21, i.e., between disk coating operations/cycles. An advantage of this embodiment is elimination of the agitator means 33, motor 14, and connecting shaft 15 of the embodiment of FIG. 1, in that the recirculation pump 31 can provide sufficient agitation of the dip coating liquid 23 contained in the dip coating liquid reservoir $29_R$ to provide adequate mixing of solvent 39 added to the dip coating liquid 23.

Thus, the present invention advantageously provides dip coating means and methodology for simultaneously performing high quality dip coating of both sides of dual-sided substrates, e.g., disk-shaped substrates utilized in the manufacture of magnetic and MO recording media, to form smooth, substantially uniform thickness dip-coated layers, e.g., resist layers, on the both surfaces thereof Such resist layers may, for example, be utilized in performing servo patterning of hard disk magnetic and MO recording media, as by thermal imprint lithography. In addition to such utility in performing servo patterning of disk substrates, the inventive means and methodology are fully compatible with all other aspects of automated manufacture of magnetic and MO media and are useful in a variety of other industrially significant applications, including, but not limited to, dip coating of semiconductor wafers as part of IC device manufacture.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present disclosure. It is to be understood that the present invention is capable of use in other combinations and environments and is susceptible of changes and/or modifications within the scope of the inventive concept as expressed herein.

What is claimed is:

1. An apparatus for performing dip coating of a layer of a resist material on a pair of opposed surfaces of a disk-shaped substrate comprising:

a dip coating vessel having an interior space adapted for containing therein a liquid for said dip coating, said dip coating liquid comprising a solution of said resist material in a solvent, said dip coating vessel being open at the top thereof;

a disk-shaped substrate mounting means for introducing into and withdrawing a disk-shaped substrate from said interior space of said dip coating vessel via said open top, said substrate mounting means including (1) means for vertically mounting said disk-shaped substrate comprising a pair of oppositely facing major surfaces to be simultaneously dip coated by immersion in said dip coating liquid contained in said dip coating vessel, and (2) means for rotating said disk-shaped substrate about a central axis; and a viscosity control system for monitoring and maintaining the viscosity of said dip coating liquid supplied to said dip coating vessel at a predetermined value.

2. The apparatus as in claim 1, wherein:

said viscosity control system includes a recirculation loop for continuously or periodically recirculating said dip coating liquid in said dip coating vessel.

3. The apparatus as in claim 2, wherein:

said recirculation loop includes a reservoir for said dip coating liquid, with an inlet conduit connected between said reservoir and said dip coating vessel for supplying said dip coating liquid from said reservoir to said dip coating vessel, and an outlet conduit connected between said dip coating vessel and said reservoir for returning said dip coating liquid from said dip coating vessel to said reservoir.

4. The apparatus as in claim 3, wherein:

said recirculation loop provides periodic recirculation of said dip coating liquid in said dip coating vessel and comprises a bypass conduit for periodically diverting, thus interrupting, flow of said dip coating liquid between said reservoir and said dip coating vessel.

5. The apparatus as in claim 4, wherein:

said recirculation loop provides recirculation of said dip coating liquid in said dip coating vessel only when said disk shaped substrate is immersed in said dip coating liquid in said dip coating vessel and includes a pair of 3-way flow control valves for flowing said dip coating liquid through said bypass conduit in response to a signal provided by said substrate mounting means.

6. The apparatus as in claim 3, wherein:

said recirculation loop further includes a pump connected to said inlet conduit for recirculating said dip coating liquid.

7. The apparatus as in claim 3, wherein:

said recirculation loop further includes a filter connected to said inlet conduit for removing particulate matter from said dip coating liquid.

8. The apparatus as in claim 3, wherein:

said recirculation loop includes a viscosity measuring device for continuously measuring the viscosity of said dip coating liquid in said reservoir and a solvent dispensing system for supplying a solvent for said resist material to said reservoir in response to the measured viscosity.

9. The apparatus as in claim 8, wherein:

said solvent dispensing system includes a tank for containing said solvent and a conduit between said solvent tank and said reservoir for supplying a flow of solvent from said solvent tank to said reservoir.

10. The apparatus as in claim 9, wherein:

said solvent dispensing system further includes a valve for controlling the flow of solvent in said conduit between said solvent tank and said reservoir, and valve flow control means responsive to the measured viscosity for controlling said solvent flow and thereby maintaining said predetermined viscosity of said dip coating liquid in said reservoir and in said dip coating vessel.

11. The apparatus as in claim 8, wherein:

said reservoir further includes agitator means for uniformly mixing said solvent supplied by said solvent dispensing system with said dip coating liquid in said reservoir.

* * * * *